United States Patent [19]

Swann et al.

[11] Patent Number: 4,739,399

[45] Date of Patent: Apr. 19, 1988

[54] TV SYSTEM FOR TRANSMISSION ELECTRON MICROSCOPES

[75] Inventors: Peter R. Swann, Diablo, Calif.; Bernd Kraus, Munich, Fed. Rep. of Germany

[73] Assignee: Gatan Inc., Pleasanton, Calif.

[21] Appl. No.: 82,273

[22] Filed: Aug. 6, 1987

[51] Int. Cl.$^4$ ............................................... H04N 7/18
[52] U.S. Cl. ..................................... 358/93; 250/311; 358/213.13; 358/229
[58] Field of Search ..................... 358/93, 213.13, 226, 358/229; 250/311

[56] References Cited

U.S. PATENT DOCUMENTS

| | | | |
|---|---|---|---|
| 4,031,390 | 6/1977 | Müller | 250/311 |
| 4,206,349 | 6/1980 | Kamimura | 250/311 |
| 4,514,629 | 4/1985 | Smith | 250/311 |
| 4,651,220 | 3/1987 | Hosol | 250/311 |
| 4,691,103 | 9/1987 | LePoole | 250/311 |

Primary Examiner—Howard W. Britton

[57] ABSTRACT

A device comprising a television camera mounted inside the projection chamber of a transmission electron microscope with the imaging surface perpendicular to the optical axis of the microscope. The electron image is converted to a light image by high efficiency YAG transmission scintillator and transferred by a low loss fiber optic plate to a CCD imaging device. The camera is moved by a pneumatic piston between the operating position where it intercepts the electron beam and a position where the electron beam can pass unobstructed to the main microscope viewing screen.

6 Claims, 2 Drawing Sheets

TV SYSTEM FOR TRANSMISSION ELECTRON MICROSCOPES

BACKGROUND

1. Field of Invention

The invention relates to television camera system for displaying on a television monitor images produced by transmission electron microscopes and particularly to systems that are positioned at the top of the microscope projection chamber.

2. Description of Prior Art

Transmission electron microscope (TEM) images are usually viewed on a fluorescent phosphor screen mounted at the base of the evacuuated microscope column. The images are of low intensity and must be viewed in a darkened room to carry out the precise focussing adjustments necessary before permanent recording of the image on photographic film. The relatively small size of the TEM viewing screen and the viewing windows make it impossible for more than two or three people to view the image at one time.

For these reasons, there is considerable interest in transferring the electron image to a television camera and displaying it on a TV monitor where it may be viewed simultaneously by many people in a lighted room and interfaced to a wide variety of electronic image processing and recording devices. the main design problem is to devise an efficient method of transferring the electron image formed inside the vacuum system to the TV camera mounted outside it.

Currently, there are two methods of coupling a television camera to the TEM. One uses a combination of lenses, mirrors and glass windows to transfer the light image, generated by a scintillator inside the microscope to a TV camera mounted outside. These lens coupled TV systems have been mounted both above and below the microscope viewing screen. Unfortunately, their poor light collection efficiency prevents them from producing clear images at the highest useful TEM magnifications and they cannot display the full resolution of the TEM.

The second approach uses a very thin transmission scintillator attached to a low loss fiber optic plate which in turn connects directly to the imaging face of a TV camera. The very low loss of direct coupling permits high resolution TEM images to be viewed easily at magnificationons up to $\times 20$ million on the TV monitor. However, the intimate contact required between the scintillator inside the vacuum and the TV camera outside is difficult to acheive and up to the present has only be obtained in systems mounted directly below the microscope viewing screen and solidly fixed to the base of the TEM projection chamber. The disadvantages of this arrangement is its incompatibility with other instrumentation, such as the electron energy loss spectrometer and other electron detectors which are normally mounted in the same position.

Most users, therefore, would find significant advantages in a camera system which produced good quality images and was compatible with other instruments mounted at the base of the TEM column.

OBJECTS AND ADVANTAGES

Accordingly several objects and advantages of this invention are: to provide a TV camera for viewing transmission electron microscope images which is compatible with a wide range of other accessories, which produces a high quality image by means of a low loss coupling to the elecron image, which may be moved between a position where it intercepts the electron beam and where the electron beam passes unobstructed to the main viewing screen, where said movement is achieved without vibration or movement of the microscope and which allows the display of low magnification images.

Readers will find further objects and advantages of the invention from a consideration of the ensuing description and the accompanying drawings.

DRAWING FIGURES

DRAWING REFERENCE NUMERALS

Figure 1:
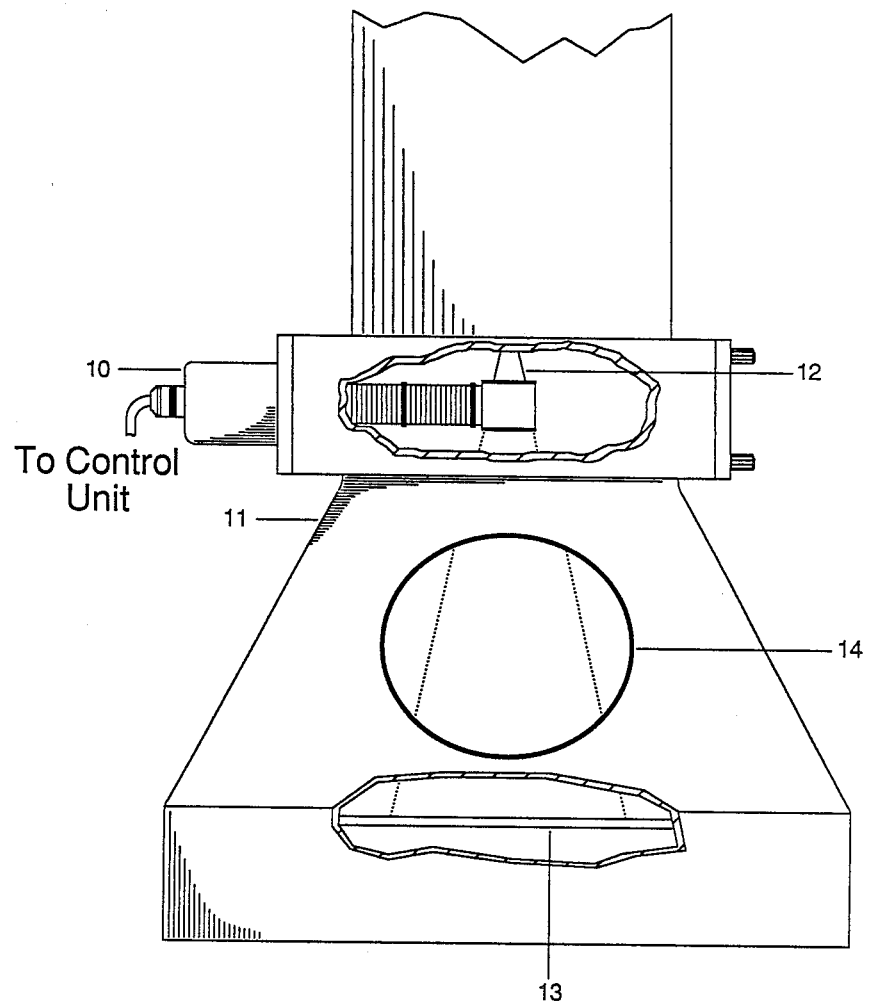
FIG. 1 shows a schematic view of the camera, mounted on a transmission electron microscope, control unit and viewing monitor.
Figure 1:
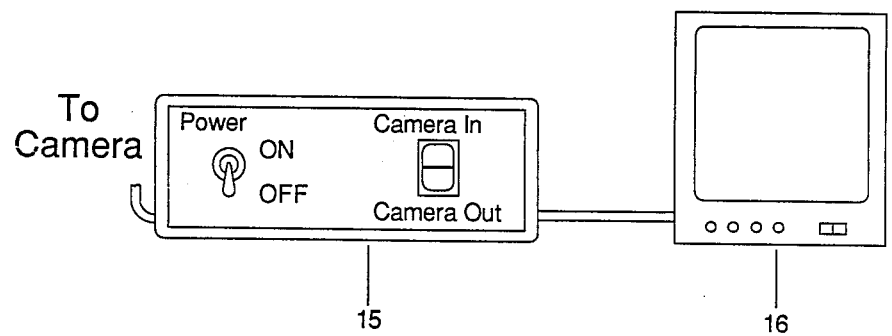

10: camera
11: microscope projection chamber
12: electrom beam
13: fluorescent viewing screen
14: glass windows
15: control unit
16: TV monitor
20: cylindrical enclosure
21: semiconductor imaging device
22: yttrium aluminum garnet transmission scintillator
23: fiber optic plate
24: arm
25: piston assembly
26: cable
27: pneumatic connector
28: orifice
29: screw clamp
30: welded bellows
31: mounting flange

DESCRIPTION

FIG. 1 shows a schematic view of camera 10 mounted on projection chamber 11 of a transmission electron microscope (TEM). The majority of TEMs are provided with one or more ports either at the top of the projection chamber or at the lower end of the column and one of these ports is utilized for mounting the camera. In conventional usage an electron beam 12 coming down the column forms an image on fluorescent viewing screen 13 which is observed through glass window 14. In the present invention, camera 10 may be moved into the path of electron beam 12 by actuating a switch on control unit 15 and an image viewed on TV monitor 16.

Figure 2:
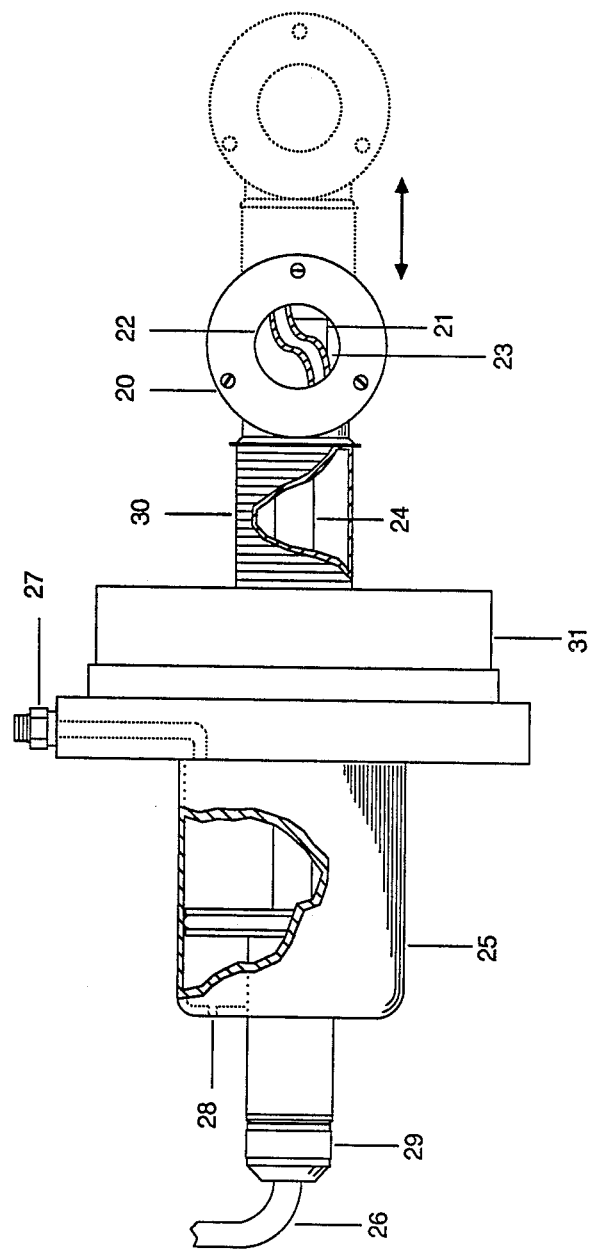
FIG. 2 shows a top view of the camera.

FIG. 2 shows a top view of the preferred embodiment of the camera assembly. The television imaging head sits inside the microscope vacuum and is shown in a retracted position. It can be moved in the direction indicated by the application of compressed gas.

The television imaging head comprises cylindrical enclosure 20, sealed top and bottom against the microscope vacuum and contains semiconductor imaging device 21. Yttrium aluminum garnet transmission scintillator 22 converts the electron image falling on its upper surface to a light image which passes through the top of enclosure 20 via fiber optic plate 23 to imaging device 21.

Enclosure 20 is attached to the end of arm 24 which connects to piston assembly 25. Cable 26 contains the electrical connections between control unit 15 (FIG. 1) and imaging device 21 and passes along the axis of arm 24. To move the imaging device into the path of the electron beam, pneumatic connector 27 is opened to atmosphere by actuating a switch on control unit 15 (FIG. 1). Since the part of the camera inside the microscope is surrounded by a vacuum, atomspheric pressure, acting through orifice 28 on the piston forces the imaging device towards the electron beam. By making orifice 28 small the piston assembly moves slowly without vibrating the microscope. To move the imaging device out of the path of the electron beam, compressed gas is applied to pneumatic connector 27 by again actuating the switch on control unit 15 (FIG. 1).

Screw clamp 29 attaches cable 26 firmly to the end of arm 24 to prevent damage to the connections to imaging device 21 should any force be accidently applied to cable 26. By moving cable 26 as an integral part of arm 24, repeated flexing of the electrical connection is minimized so preventing fatigure failure.

Movement of arm 24 and the imaging device assembly is taken up by the compression and extension of welded bellows 30. Thus gas leakage from piston assembly 25 around sliding seals does not degrade the microscope vacuum.

The pneumatic circuit is constructed so that the valve directing compressed gas to the pneumatic drive is of the normally open type. Loss of electrical power either by switching off or power failure results in the valve opening and the automatic movement of the camera head to the withdrawn position. This provides a degree of protection against damage when e.g. a user turns off the camera without remembering to move the head to the withdrawn position and then proceeds to operate the microscope in a mode, such as electron diffraction, which results in a very high intensity impinging on the viewing screen.

Mounting flange 31 holds the camera assembly and connects to the column of the microscope.

In an alternative embodiment of the deivce fiber optic plate 23 is replaced with a lens assembly. After the electron image has been converted to a light image it is transferred to the semiconductor imaging device via the lens assembly. This version introduces additional inversions of the image to permit control of the image orientation on the viewing monitor. However, the greater size and higher losses of this version outweigh the advantage of a correctly oriented image.

While the above description contains many specificities, the reader should not construe these as limitations on the scope of the invention but merely as exemplifications of the preferred embodiments thereof. Those skilled in the art will envisage other possible variations within its scope. For example, the device claimed may be mounted on the base of the TEM projection chamber to allow the display of very high magnification images without interfering with the operation of, for example, an electron spectrometer.

What is claimed is:

1. A device to detect and display electron images generated by a transmission electron microscope comprising an hermetically sealed television camera with imaging surface intercepting and perpendicular to the optic axis of said transmission electron microscope and a mechanism to move said camera into and away from the optic axis within the vacuum of said electron microscope.

2. A deivce as claimed in claim 1 where the electron image is converted to a light image by a single crystal yttrium aluminum garnet transmission scintillator and is transferred to the imaging surface of the camera by a fiber optic plate.

3. A device as claimed in claim 1 where the electron image is converted to a light image by a single crystal yttrium aluminum garnet transmission scintillator and is transferred to the imaging surface of the camera by a lens assembly.

4. A device as claimed in claim 1 where the television imaging head is a semiconductor charge coupled device array.

5. A device as claimed in claim 1 where the mechanism moving the television imagng head is a pneumatic piston.

6. A device as claimed in claim 1 where the mechanism moving the television imaging head is a pneumatic piston which automatically withdraws the television imaging head from the electron beam when power is removed from the TV control circuits.

* * * * *